United States Patent
Choi et al.

(10) Patent No.: US 7,642,811 B2
(45) Date of Patent: *Jan. 5, 2010

(54) SLEW RATE CONTROLLED OUTPUT DRIVER FOR USE IN SEMICONDUCTOR DEVICE

(75) Inventors: Seok-Woo Choi, Kyoungki-do (KR); Hong-June Park, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 21 days.

This patent is subject to a terminal disclaimer.

(21) Appl. No.: 12/011,420

(22) Filed: Jan. 25, 2008

(65) Prior Publication Data
US 2009/0002031 A1 Jan. 1, 2009

Related U.S. Application Data

(63) Continuation of application No. 11/020,771, filed on Dec. 21, 2004, now Pat. No. 7,339,409.

(30) Foreign Application Priority Data
Mar. 3, 2004 (KR) .............................. 2004-14418

(51) Int. Cl.
*H03K 19/082* (2006.01)
(52) U.S. Cl. .................................. 326/87; 326/83
(58) Field of Classification Search ............. 326/83–87
See application file for complete search history.

(56) References Cited

U.S. PATENT DOCUMENTS

| | | | | |
|---|---|---|---|---|
| 4,859,870 A | * | 8/1989 | Wong et al. | 327/108 |
| 5,291,071 A | * | 3/1994 | Allen et al. | 327/108 |
| 5,568,081 A | * | 10/1996 | Lui et al. | 327/380 |
| 5,748,019 A | * | 5/1998 | Wong et al. | 327/170 |
| 5,959,481 A | | 9/1999 | Donnelly et al. | |
| 6,005,821 A | | 12/1999 | Knaack et al. | |
| 6,047,346 A | | 4/2000 | Lau et al. | |
| 6,262,617 B1 | | 7/2001 | McClure | |
| 6,281,730 B1 | | 8/2001 | Vu | |
| 6,504,396 B2 | | 1/2003 | Sher et al. | |
| 6,646,483 B2 | | 11/2003 | Shin | |
| 6,784,708 B1 | | 8/2004 | Krenzke | |
| 6,803,790 B2 | * | 10/2004 | Haycock et al. | 326/82 |
| 7,368,951 B2 | * | 5/2008 | Iwasaki | 326/86 |
| 2003/0001632 A1 | * | 1/2003 | Anderson et al. | 327/112 |

* cited by examiner

*Primary Examiner*—Don P Le
(74) *Attorney, Agent, or Firm*—Blakely, Sokoloff, Taylor & Zafman LLP

(57) ABSTRACT

An output driver for use in a semiconductor is capable of maintaining its slew rate constantly regardless of PVT (Process/Voltage/Temperature) variation. The output driver includes a pre-driving unit for pre-driving a data signal; a main driving unit for driving an output pad in response to the output signal of the pre-driving unit; and a slew rate modeling unit for generating a pre-driver bias signal to constantly maintain effective resistances of a pull-up path and a pull-down path of the pre-driving unit by modeling the pre-driving unit.

16 Claims, 11 Drawing Sheets

SLEW RATE CONTROLLED OUTPUT DRIVER FOR USE IN SEMICONDUCTOR DEVICE

CROSS-REFERENCE TO RELATED APPLICATION

The present patent application is a continuation of application Ser. No. 11/020,771, filed Dec. 21, 2004 now U.S. Pat. No. 7,339,409.

FIELD OF INVENTION

The present invention relates to a semiconductor circuit technique; and, more particularly, to an output driver for use in a semiconductor device.

DESCRIPTION OF PRIOR ART

An output driver for use in a semiconductor device is a driving circuit for driving an output pad coupled to a certain load to output data from an internal element to any external element.

Generally, a push-pull type driver has been widely used as such an output driver. With regard to the push-pull type driver, slew rate control becomes an importance issue.

The slew rate is an index for representing how fast the voltage level of the output signal changes, which may be defined as a slope depicting voltage level change per unit time. On the other hand, there are up slew rate and down slew rate in the slew rate. The up slew rate represents the slope when the voltage level of the output signal has a transition from a low level to a high level while the down slew rate represents the slope when the voltage level of the output signal has a transition from the high level to the low level. In any case, the larger slew rate shows the more abrupt slope of the output signal, which means the voltage level changes in shorter time.

FIG. 1 is a circuit diagram showing a typical push-pull type output driver.

Referring to FIG. 1, the typical push-pull type output driver includes a pull-up PMOS transistor MP1 and a pull-down NMOS transistor MN1 and performs charge (pull-up) and discharge (pull-down) for a load capacitor $C_L$.

When the slew rate is large, the push-pull type output driver is advantageous in terms of data skew but has a shortcoming of increase in switching noise because of inductances L1, L2 on a pin. To the contrary, when the slew rate is small, the switching noise decreases but the data skew increases, even to the extent that the signal shows the transition before the level of the output signal reaches its peak point. Accordingly, it is important to design the push-pull type output driver that can be controlled to maintain the slew rate properly and constantly.

FIG. 2 is a circuit diagram showing a conventional push-pull type output driver for controlling slew rate by using a pre-driver.

Referring to FIG. 2, the push-pull type output driver includes a main driver including a pull-up PMOS transistor MP1 and a pull-down NMOS transistor MN1 and a pre-driver 20 arranged in front of the main driver.

The pre-driver 20 is constructed with transistors of different size from the main driver. The slew rate of the output signal is fixed by adjusting the rising time and the falling time of the output signal DRV of the pre-driver 20 by using the size difference between the pre-driver 20 and the main driver.

However, with this scheme, a problem occurs when there is any PVT (Process/Voltage/Temperature) variation. Generally, three times of slew rate change can be seen between slow condition and fast condition to affect adversely signal maintenance. Though such a problem was not so serious with low transmission rate, it would burden significantly in accomplishing higher transmission rate such as over 800 Mbps and even over 1 Gbps. Accordingly, there has been effort to develop an output driver capable of maintaining its slew rate constantly regardless of PVT variation.

FIG. 3 is a circuit diagram showing a conventional push-pull type output driver for controlling slew rate by using a delay.

Referring to FIG. 3, the push-pull type output driver includes a first delay and a second delay 30, 32, the second delay 32 having a larger delay than the first delay 30, and a first to third drivers 34, 3, 38 receiving an input signal IN and delayed input signals from the first and second delays 30, 32, respectively, the first driver being smallest and the third driver being largest.

When the input signal IN is inputted, the smallest first driver 34 drives a pin, and then the second driver 36 is activated after the delay of the first delay 30 and, finally, the third driver 38 is activated to drive the pin after the delay of the second delay 32.

In this case, the switching noise decreases greatly because current value of the output signal varies slowly. This result could be achieved assuming that the delays of the first and second delays 30, 32 are fixed. However, there is a problem such that the slew rate is not robust for PVT variation because the delay amounts of the delay elements in the first and second delays 30, 32 vary depending on PVT variation. Further, in this approach, there is a high transmission problem because of inevitable output delay.

On the other hand, there is another scheme for adjusting the slew rate, which uses the output waveform. However, because that this waveform contains much noise, ISI and so on, it not easy to adjust the output waveform with feedback.

FIG. 4 is a circuit diagram showing a conventional push-pull type output driver for controlling slew rate with adjustment of a waveform on a pre-driving node.

Referring to FIG. 4, the output driver includes a pre-driver unit for pre-driving data signal IN in response to an enable signal en and a digital weighting dw, a pre-driving node waveform adjusting unit for adjusting capacitance of a pre-driving node in response to control code values c0, c1, f0, f1, f2 that are determined based on PVT variation on the pre-driving node, and a main driver unit for driving an output pad in response to the voltage level on the pre-driving node.

In the output driver shown in FIG. 4, the slew rate is controlled with adjustment of the waveform on the pre-driving node. That is, if the slew rate of the pre-driving node is maintained constantly, the slew rate of the main driver that is driven by the pre-driving node can be maintained constantly.

The pre-driving node waveform adjusting unit uses the control code values c0, c1, f0, f1, f2 with use of an internal PVT sensing circuit for adjusting the capacitance of the pre-driving node. At this point, as the control code values increase, the capacitance of the pre-driving node increases to make the slew rate smaller. To the contrary, as the control code values decrease, the capacitance of the pre-driving node decrease to make the slew rate larger.

In this case, the output driver has its slew rate robust to PVT variation. However, the control code values should be changed to maintain the slew rate constantly after measuring PVT variation accurately and resistances of switching transistors should be small to show pure capacitance. For this, there should be included the significantly large transistors and, accordingly, large parasitic component, which have a difficulty in high-speed operation.

SUMMARY OF INVENTION

It is, therefore, an object of the present invention to provide an output driver for use in a semiconductor, for capable of maintaining its slew rate constantly regardless of PVT (Process/Voltage/Temperature) variation.

In accordance with an aspect of the present invention, there is provided an output driver for use in a semiconductor device, including a pre-driving unit for pre-driving a data signal; a main driving unit for driving an output pad in response to the output signal of the pre-driving unit; and a slew rate modeling unit for generating pre-driver bias signals to constantly maintain effective resistances of a pull-up path and a pull-down path of the pre-driving unit by modeling the pre-driving unit.

In accordance with an aspect of the present invention, there is provided an output driver for use in a semiconductor device an output driver for use in a semiconductor device, including a pre-driving unit for pre-driving a data signal; a main driving unit for driving an output pad in response to the output signal of the pre-driving unit; a slew rate modeling unit for generating pre-driver bias signals to constantly maintain effective resistances of a pull-up path and a pull-down path of the pre-driving unit by modeling the pre-driving unit; and an output level modeling unit for generating a main driver bias signals to constantly maintain a pull-up output level and a pull-down output level of the main driving unit by modeling the main driving unit.

Desirably, the slew rate modeling means includes an external resistor coupled between the power supply voltage and the dummy pad; a first comparator for comparing the potential on the dummy output pad with a reference voltage; a first pre-driver pull-down replica coupled between the dummy output pad and a ground voltage for maintaining the potential on the dummy output pad at the level of the reference voltage under control of a pre-driver pull-down bias signal from the first comparator; a second pre-driver pull-down replica coupled between the ground voltage and a first node, the second pre-driver pull-down replica having the same configuration as the first pre-driver pull-down means replica; a second comparator for comparing the potential on the first node with the potential on the dummy output pad; and a pre-driver pull-up replica for maintaining the potential on the first node at the level of the reference voltage under control of a pre-driver pull-up bias signal from the second comparator.

Desirably, the output level modeling means includes a first external resistor coupled between a termination voltage and a first dummy output pad and having the same resistance as a termination resistor that is coupled to the output pad; a third comparator for comparing the potential on the first dummy output pad with a low reference voltage; a main driver pull-down replica coupled between the first dummy output pad and the ground voltage for determining the potential on the first dummy output pad under control of a pull-down output level bias signal from the third comparator; a second external resistor coupled between the termination voltage and a second dummy output pad and having the same resistance as the termination resistor that is coupled to the output pad; a fourth comparator for comparing the potential on the second dummy output pad with a high reference voltage; and a main driver pull-up replica controlled under a pull-up output level bias signal from the fourth comparator.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an output driver for use in a semiconductor device in accordance with the present invention will be described in detail referring to the accompanying drawings.

The present invention employs an output driver of SSTL type push-pull structure because it is difficult to control slew rate because a waveform in pull-up operation is determined only with passive elements while the waveform in pull-down operation can be controlled somehow with open drain technique. Therefore, a push-pull type output driver is targeted to adjust by itself for both pull-up and pull-down operations. On the other hand, instead of the conventional binary weighting technique, the slew rate is adjusted by using only one transistor with replica bias technique in the present invention.

Hereinafter, it will be described for a preferred embodiment of the present invention for those skilled in the art to readily practice the present invention.

Figure 1:
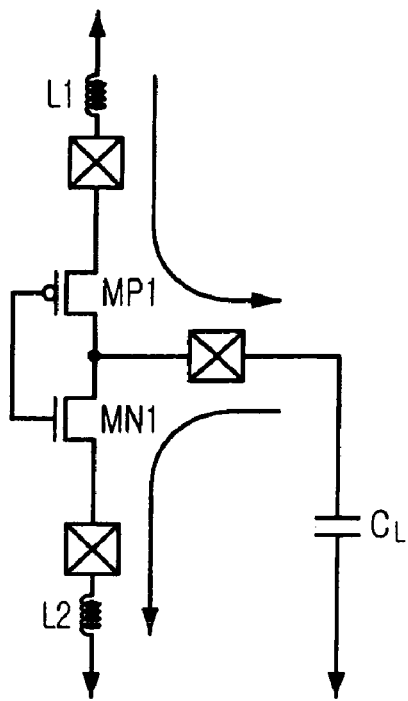
FIG. 1 is a circuit diagram showing a typical push-pull type output driver.
Figure 2:
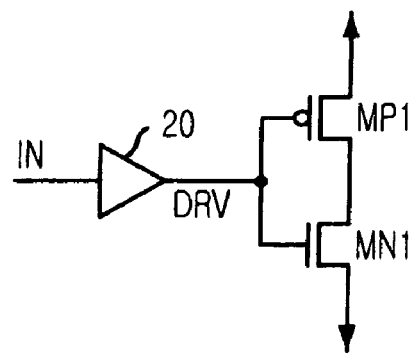
FIG. 2 is a circuit diagram showing a conventional push-pull type output driver for controlling slew rate by using a pre-driver.
Figure 3:
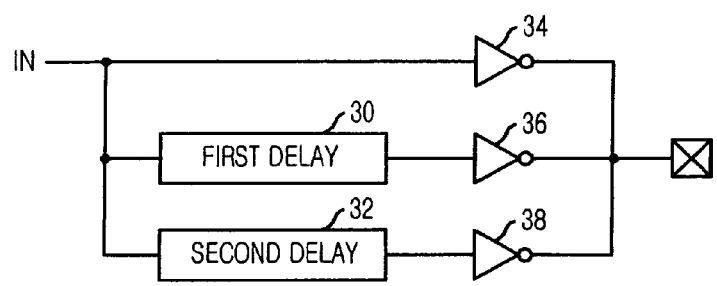
FIG. 3 is a circuit diagram showing a conventional push-pull type output driver for controlling slew rate by using a delay.
Figure 4:
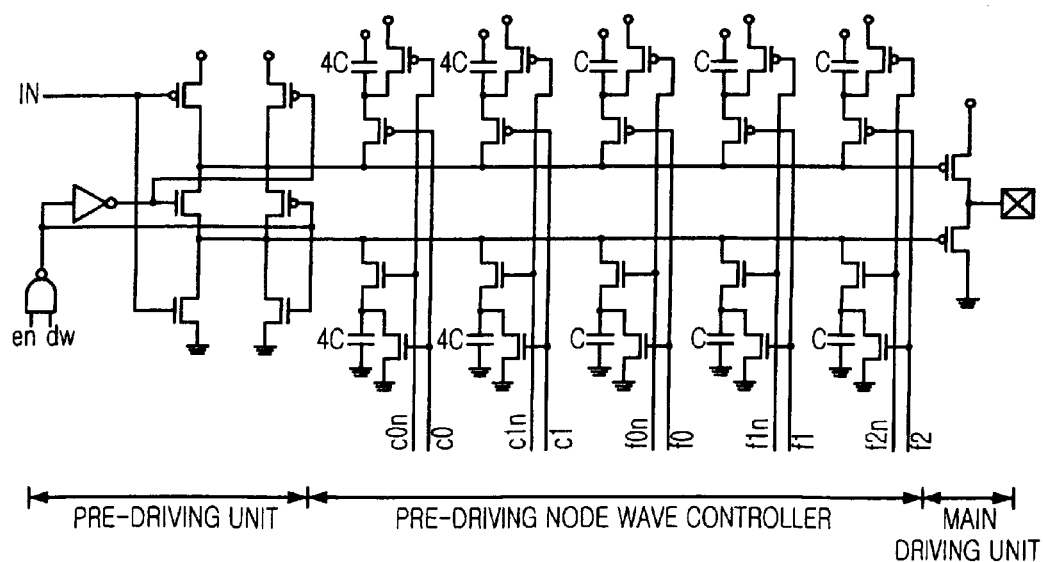
FIG. 4 is a circuit diagram showing a conventional push-pull type output driver for controlling slew rate with adjustment of a waveform on a pre-driving node.
Figure 5:
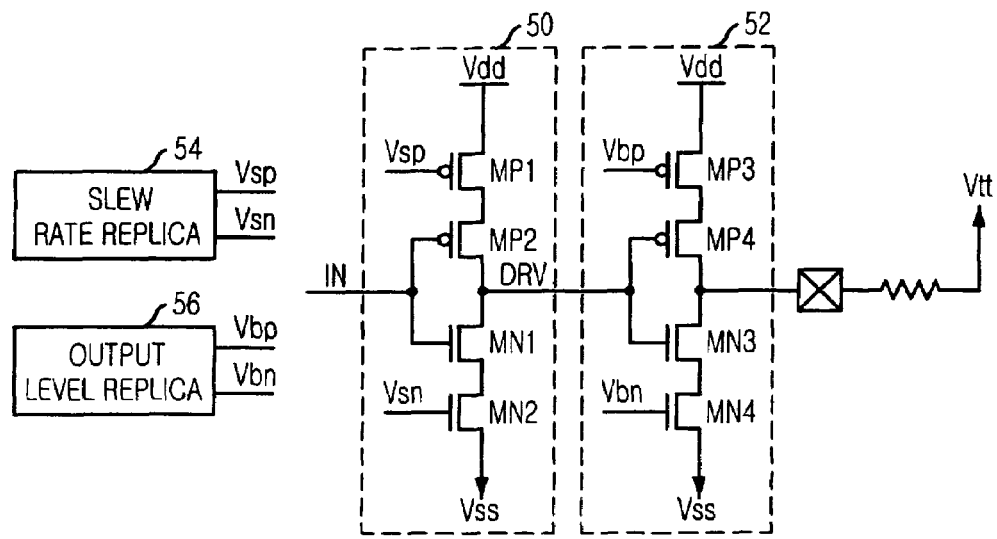
FIG. 5 is a circuit diagram showing a push-pull type output driver in accordance with an embodiment of the present invention.

FIG. 5 is a circuit diagram showing a push-pull type output driver in accordance with an embodiment of the present invention.

Referring to FIG. 5, the push-pull type output driver of the present invention includes a pre-drivers 50 for pre-driving a data signal IN; a main driver 52 for driving an output pad in response to a voltage level DRV of a pre-driving node; a slew rate replica 54 for generating pre-driver bias signals Vsp, Vsn to constantly maintain effective resistances of a pull-up path and a pull-down path of the pre-driver 50 by modeling the pre-driver 50; and an output level replica 56 for generating main driver bias signals Vbp, Vbn to constantly maintain the pull-up output level and the pull-down output level of the main driver 52 by modeling the main driver 52.

Here, the pre-driver 50 includes a PMOS transistor MP1 coupled to a power supply voltage vdd and having a gate receiving the pre-driver pull-up bias signal Vsp; a PMOS transistor MP2 coupled between the PMOS transistor MP1 and the pre-driving node DRV and having a gate receiving the data signal IN; a NMOS transistor MN2 coupled to a ground voltage vss and having a gate receiving the pre-driver pull-down bias signal Vsn; and a NMOS transistor MN1 coupled between the NMOS transistor MN2 and the pre-driving node DRV and having a gate receiving the data signal IN.

Further, the main driver includes a PMOS transistor MP3 coupled the power supply voltage vdd and having a gate receiving the pull-up output level bias signal Vbp; a PMOS transistor MP4 coupled between the PMOS transistor MP3 and the output pad and having a gate receiving the output signal of the pre-driver 50; a NMOS transistor MN4 coupled to the ground voltage vss and having a gate receiving the pull-down level bias signal Vbn; and a NMOS transistor MN3 coupled between the NMOS transistor MN4 and the output pad and having a gate receiving the output signal of the pre-driver 50.

Figure 6:
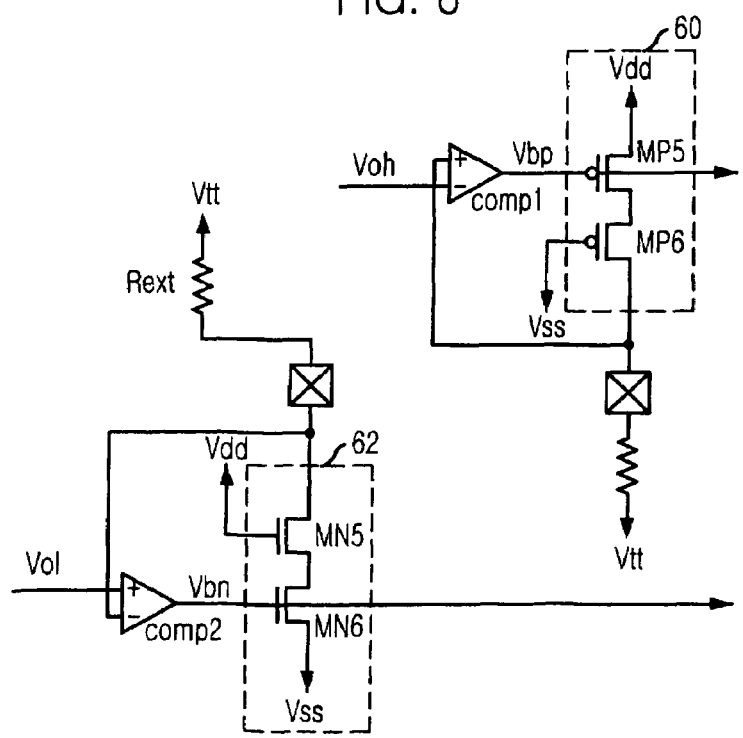
FIG. 6 is a diagram showing circuit configuration of an output level replica shown in FIG. 5.

FIG. 6 is a diagram showing circuit configuration of the output level replica 56 shown in FIG. 5.

Referring to FIG. 6, the output level replica 56 includes an external resistor Rext coupled between a termination voltage vtt and a first dummy output pad and having the same resistance as a termination resistor that is coupled to the output pad; a comparator comp2 for comparing the potential on the first dummy output pad with a low reference voltage Vol; a main driver pull-down replica 62 coupled between the first dummy output pad and the ground voltage vss for determining the potential on the first dummy output pad under control of a pull-down output level bias signal Vbn from the comparator comp2; an external resistor Rext coupled between the termination voltage vtt and a second dummy output pad and having the same resistance as the termination resistor that is coupled to the output pad; a comparator for comparing the potential on the second dummy output pad with a high reference voltage Voh; and a main driver pull-up replica 60 controlled under a pull-up output level bias signal Vbp from the comparator comp1.

Here, the main driver pull-up replica 60 includes a PMOS transistor MP5 coupled to the power supply voltage vdd and having a gate receiving the pull-up output level bias signal Vbp, and a PMOS transistor MP6 coupled between the PMOS transistor MP5 and the second dummy output pad and having a gate receiving the ground voltage vss.

Further, the main driver pull-down replica 62 includes a NMOS transistor MN5 coupled to the first dummy output pad and having a gate receiving the power supply voltage vdd; and a NMOS transistor MN6 coupled between the NMOS transistor MN5 and the ground voltage vss and having a gate receiving the pull-down output level bias signal Vbn.

Here, the size of the transistors in the main driver pull-up replica 60 and the main driver pull-down replica 62 may be smaller (e.g., about 1/10) than the size of the transistors in the actual main driver 52 so as to reduce current consumption.

The main driver pull-up replica 60 determines the level of a pull-up output level bias signal Vbp with negative feedback operation of the comparator comp1 to maintain the potential in Voh on the second dummy output pad when the PMOS transistors MP5, MP6 that are replica of the PMOS transistors MP3, MP4 in the main driver 52 have performed pull-up operation. This value means that the voltage that is generated on the pull-up path of the main driver 52 that is controlled with the pull-up output level bias signal Vbp is maintained as Voh when the data signal IN is in the logic level low.

On the other hand, the main driver pull-down replica 62 determines the level of the pull-down output level bias signal Vbn with the negative feedback operation of the comparator comp2 to maintain the potential on the first dummy output pad in Vol when the NMOS transistors MN5, MN6 that are replica of the NMOS transistors MN3, MN4 of the main driver 52 have performed pull-down operation. This value means that the voltage that is generated on the pull-down path of the main driver 52 that is controlled with the pull-down output level bias signal Vbn is maintained as Vol when the data signal IN is in the logic level high.

The pull-up slew rate bias signal Vbp and the pull-down slew rate bias signal Vbn are supplied to the main driver 52 through the voltage buffer so as to maintain Voh and Vol constantly regardless of PVT variation.

Figure 7:
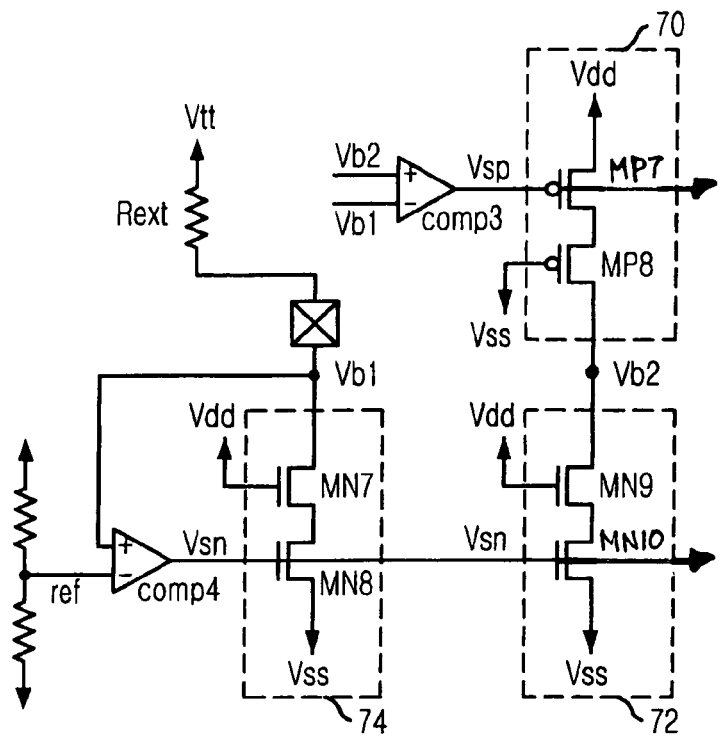
FIG. 7 is a diagram showing circuit configuration of a slew rate replica shown in FIG. 5.

FIG. 7 is a diagram showing circuit configuration of the slew rate replica 54 shown in FIG. 5.

Referring to FIG. 7, the slew rate replica 54 includes an external resistor Rext coupled between the power supply voltage vdd and the dummy pad; a comparator comp4 for comparing the potential Vb1 on the dummy output pad with a reference voltage ref; a pre-driver pull-down replica 74 coupled between the dummy output pad and a ground voltage vss for maintaining the potential Vb1 on the dummy output pad at the level of the reference voltage ref under control of a pre-driver pull-down bias signal Vsn from the comparator comp4; a pre-driver pull-down replica 72 coupled between the ground voltage vss and a node vb2, the second pre-driver pull-down replica 72 having the same configuration as the first pre-driver pull-down replica 74; a comparator for comparing the potential on the node Vb2 with the potential Vb1 on the dummy output pad; and a pre-driver pull-up replica 70 for maintaining the potential on the node Vb2 at the level of the reference voltage ref under control of a pre-driver pull-up bias signal Vsp from the comparator comp3.

Here, the pre-driver pull-replica 70 includes a PMOS transistor MP7 coupled to the power supply voltage vdd and having a gate receiving a pre-driving pull-up bias signal Vsp, and a PMOS transistor MP8 coupled between the PMOS transistor MP7 and the node vb1 and having a gate receiving the ground voltage vss.

Further, the first pre-driver pull-down replica 74 includes a NMOS transistor MN7 coupled to the dummy output pad and having a gate receiving the power supply voltage vdd; and a NMOS transistor MN8 coupled between the NMOS transistor MN7 and the ground voltage vss and having a gate receiving the pre-driver pull-down bias signal vsn.

Further, the second pre-driver pull-down replica 72 includes a NMOS transistor MN9 coupled to the node Vb2 and having a gate receiving the power supply voltage vdd; and a NMOS transistor MN10 coupled between the NMOS transistor MN9 and the ground voltage vss and having a gate receiving the pre-driver pull-down bias signal Vsn.

Here, the size of the transistors in the pre-driver pull-up replica and the first and the second pre-driver pull-down replica 74, 72 may be smaller (e.g., about 1/10) than the size of the transistors in the actual pre-driver 50 so as to reduce current consumption.

That is, the external resistor Rext and the first pre-driver pull-down replica 74 that models the pull-down path of the pre-driver 50 are arranged between the power supply voltage vdd and the ground voltage vss to determine the potential vb1 on the dummy output pad by voltage distribution with the effective resistance of the first pre-driver pull-down replica 74, which is fedback negatively to the comparator comp4 to control the pre-driver pull-down bias signal Vsn such that the potential on the dummy output pad is equal to the reference voltage ref. Here, the reference voltage ref is made to have ½ vdd level by arranging resistors of same resistance between the power supply voltage vdd and the ground voltage vss. When the level of the pre-driver pull-down bias signal Vsn is equal to the level of the reference voltage ref, the effective resistances of the external resistor Rext and the first pre-driver pull-down replica 74 are equal to each other.

Similarly, in the pre-driver pull-up replica 70, the pre-driver pull-up bias signal Vsp is controlled such that the first and second pre-driver pull-down replica 74, 72 have the same effective resistance.

Accordingly, the effective resistances of the external resistor Rext, the first and the second pre-driver pull-down replica 74, 72 and the pre-driver pull-up replica 70 are equal to each other. The pre-driver pull-down bias signal Vsn and the pre-driver pull-up bias signal Vsn are supplied to the pre-driver to constantly maintain the effective resistance of the pull-down path and the pull-up path of the pre-driver 50 so that the pre-driving node DRV has constant pull-down and pull-up characteristic without regard to PVT, which makes it possible to control the slew rate of the output driver constantly.

Figure 8:
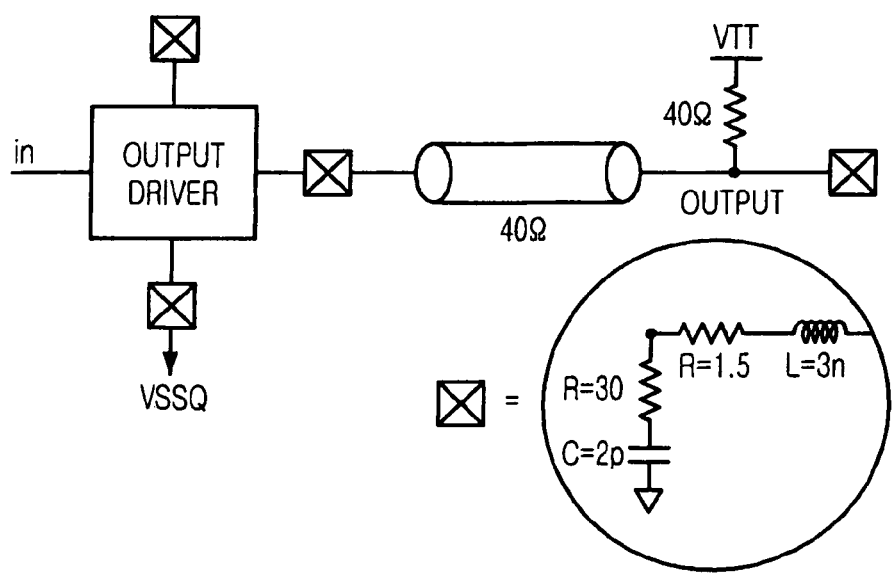
FIG. 8 is a diagram showing environment for simulation of an output driver in accordance with an embodiment of the present invention.

FIG. 8 is a diagram showing environment for simulation of an output driver in accordance with the embodiment of the present invention.

Referring to FIG. 8, the output signal from the output driver is matched with 40Ω impedance through 40Ω transmission line having 10 cm length. Further, vtt is assumed as ½ vdd and the model of the output pad is depicted as inside of a circle. On the other hand, it is assumed that three output drivers are driven simultaneously through one power supply voltage vdd pin and one ground voltage vss pin.

Figure 9A:
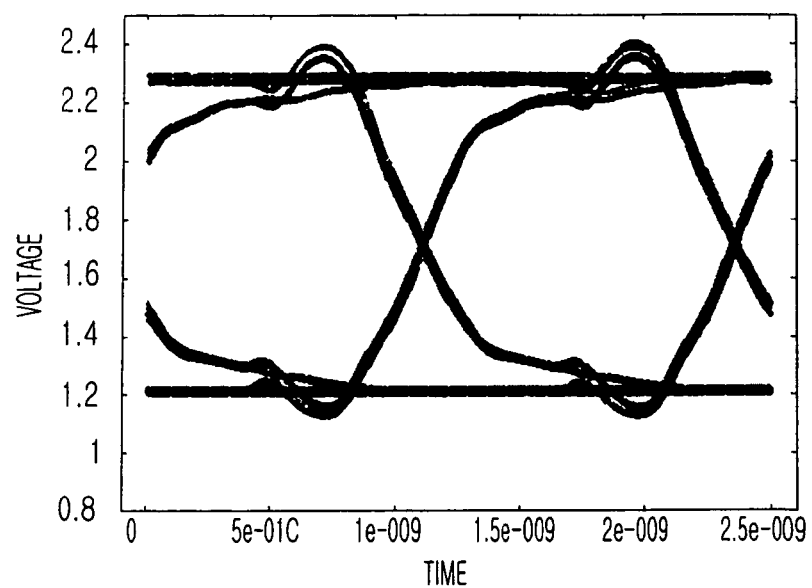
FIG. 9 is an eye diagram for a receiver at 800 Mbps transmission rate.
Figure 9B:
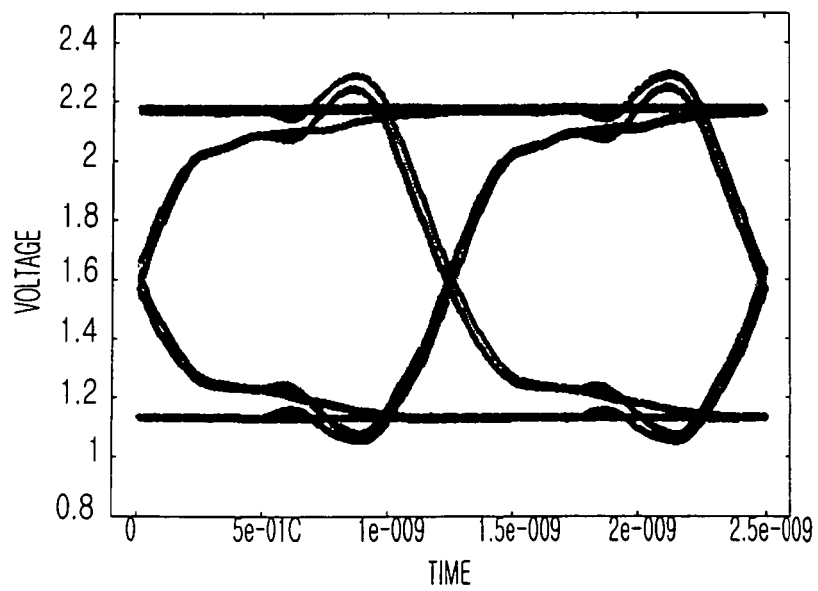
Figure 9C:
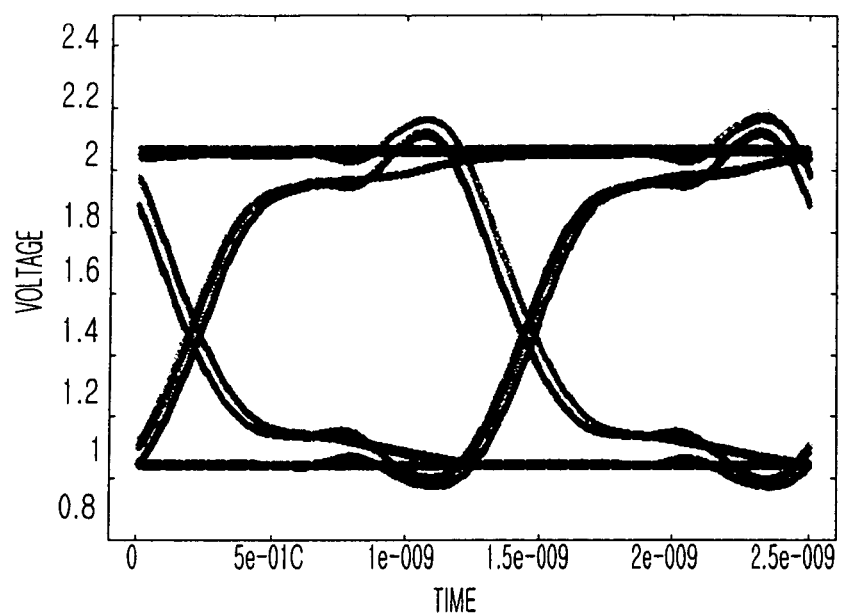

FIG. 9 is an eye diagram for a receiver at 800 Mbps transmission rate. In FIG. 9, (a) shows slow condition, (b) shows normal condition and (c) shows fast condition.

Figure 10A:
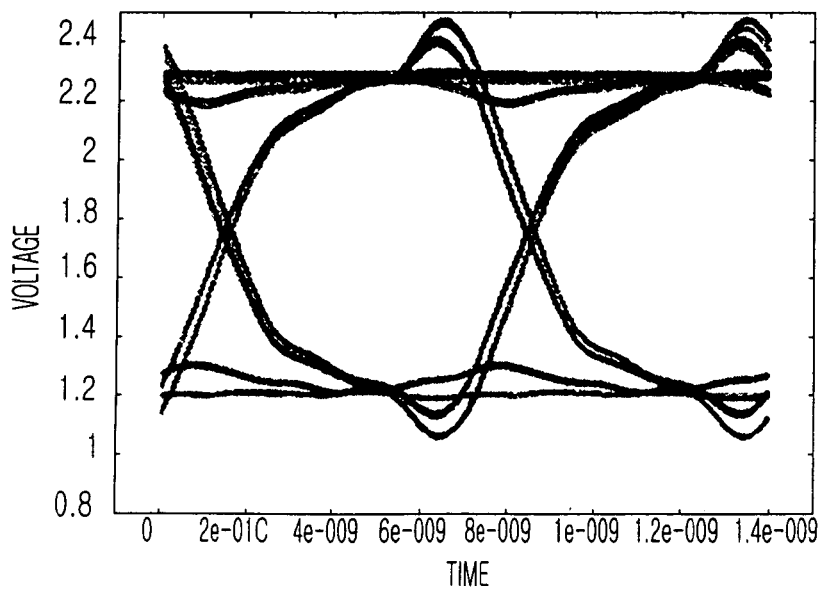
FIG. 10 is an eye diagram for a receiver at 1.4 Gbps transmission rate.
Figure 10B:
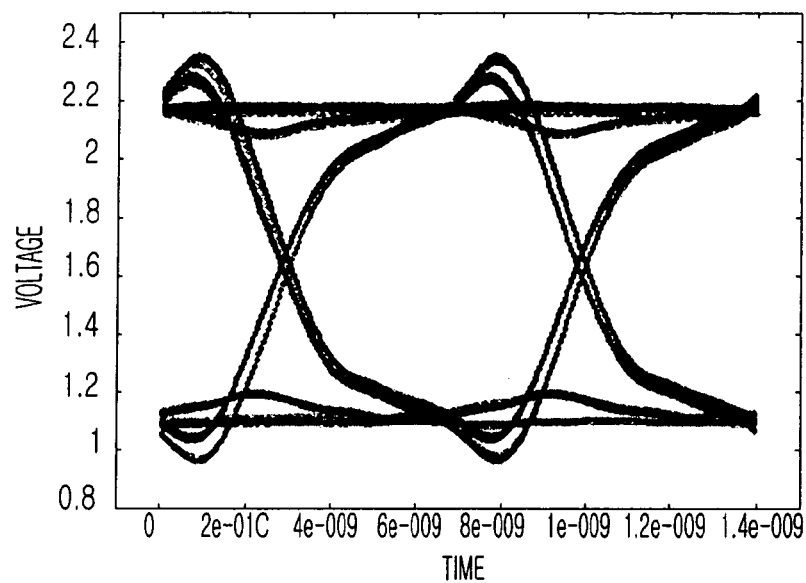
Figure 10C:
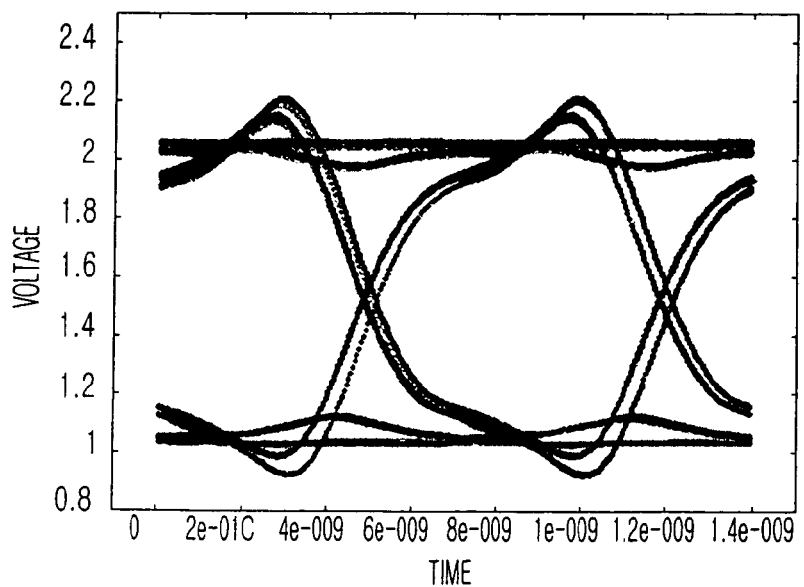

On the other hand, FIG. 10 is an eye diagram for a receiver at 1.4 Gbps transmission rate. In FIG. 10, (a) shows slow condition, (b) shows normal condition and (c) shows fast condition.

For 800 Mbps transmission rate, slew resistance is 1.6 kΩ. For 1.4 Gbps transmission rate, slew resistance is 0.6 kΩ. As shown in FIGS. 9 and 10, the eye patterns shows no change even in PVT variation. Each condition is as follows.

TABLE 1

| Condition | Process | Power Supplied Voltage | Temperature |
|---|---|---|---|
| Slow | NMOS slow, PMOS slow | 3.0 V | 80° C. |
| Normal | NMOS normal, PMOS normal | 3.3 V | 40° C. |
| Fast | NMOS fast, PMOS fast | 3.6 V | 0° C. |

Figure 11A:
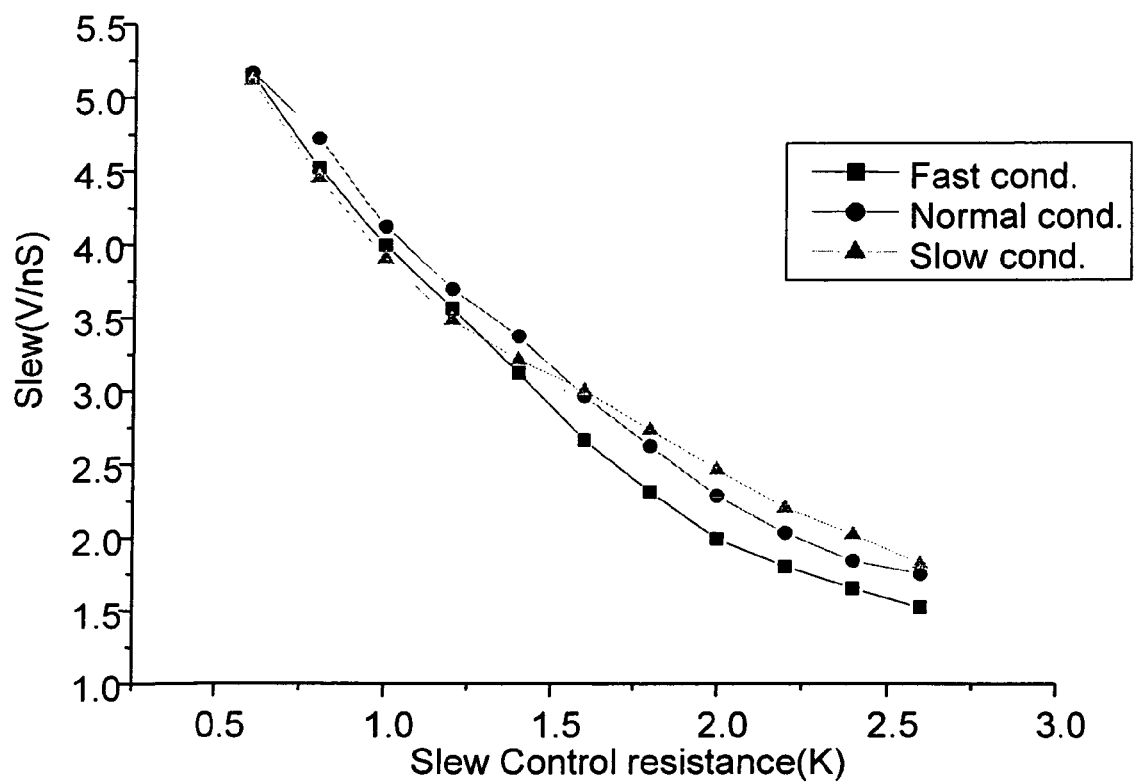
FIG. 11 is a characteristic diagram showing slew rate change depending on slew resistance change.
Figure 11B:
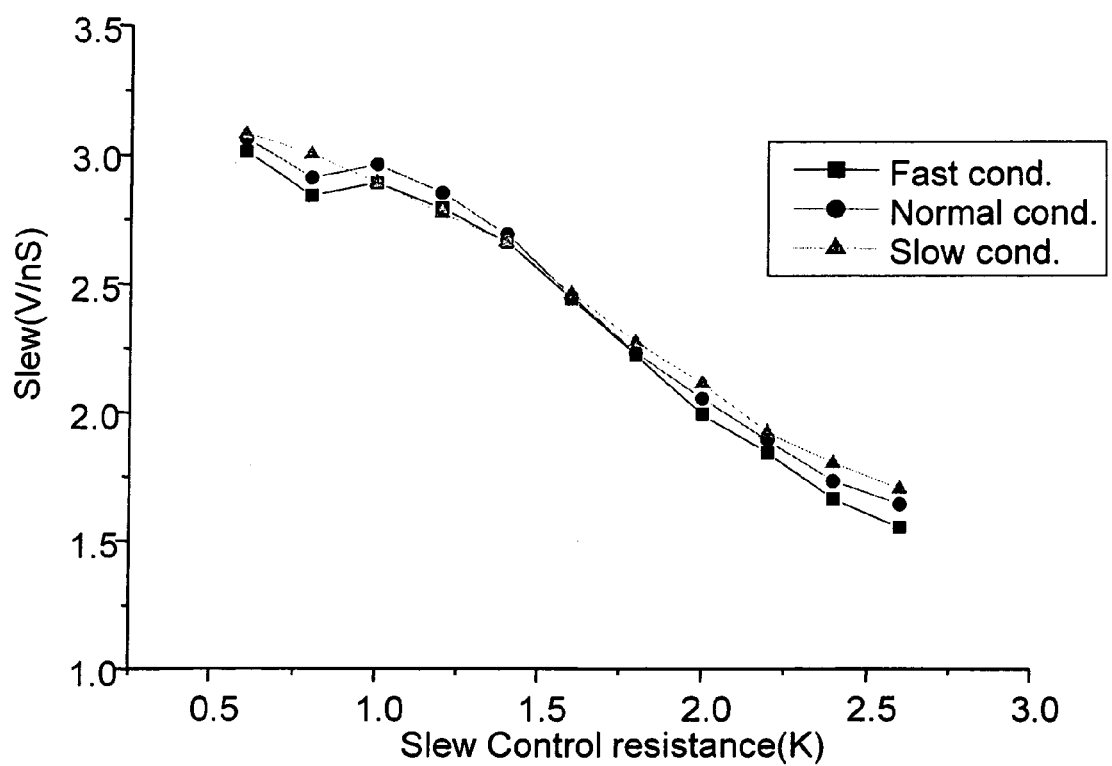

On the other hand, FIG. 11 is a characteristic diagram showing slew rate change depending on slew resistance change. Here, (a) shows simulation in the case of 2 pF load capacitance and (b) shows simulation in the case of 5 pF load capacitance. As shown in FIG. 11, the slew rate is substantially constant without regard to load capacitance change.

Figure 12A:
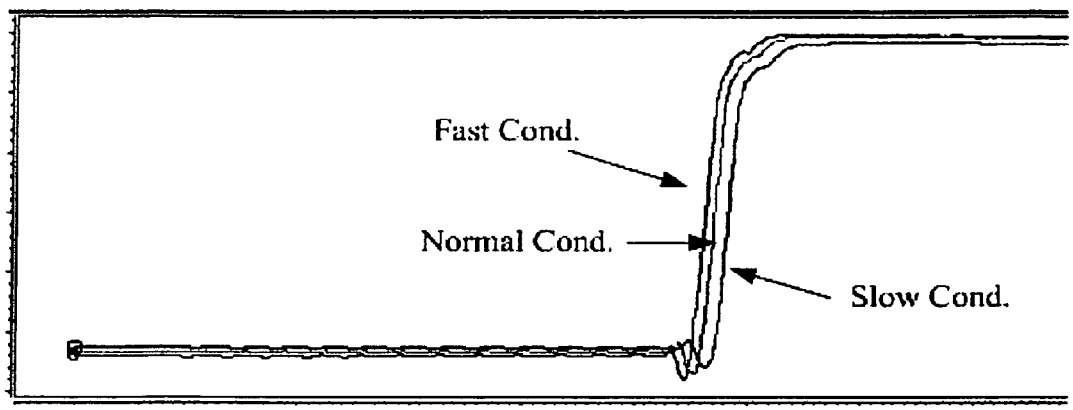
FIG. 12 is a diagram showing a 0-1 transition waveform of a output driver.
Figure 12B:
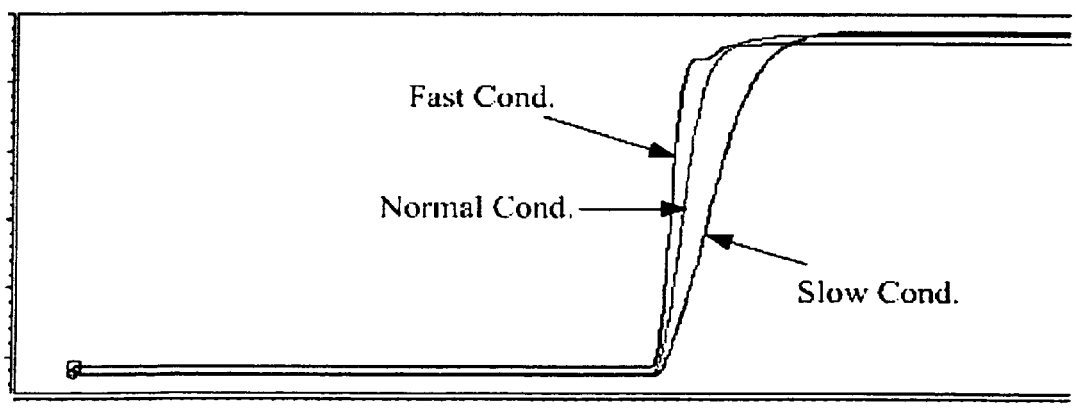

FIG. 12 is a diagram showing a 0-1 transition waveform of a output driver. Here, (a) shows an output driver of the present invention and (b) shows an output driver in prior art. Referring to FIG. 12, the output driver in prior art shows significant variation in its waveform depending on PVT variation while the output driver of the present invention shows substantially constant slew rate and just little difference of delay under PVT variation.

Figure 13:
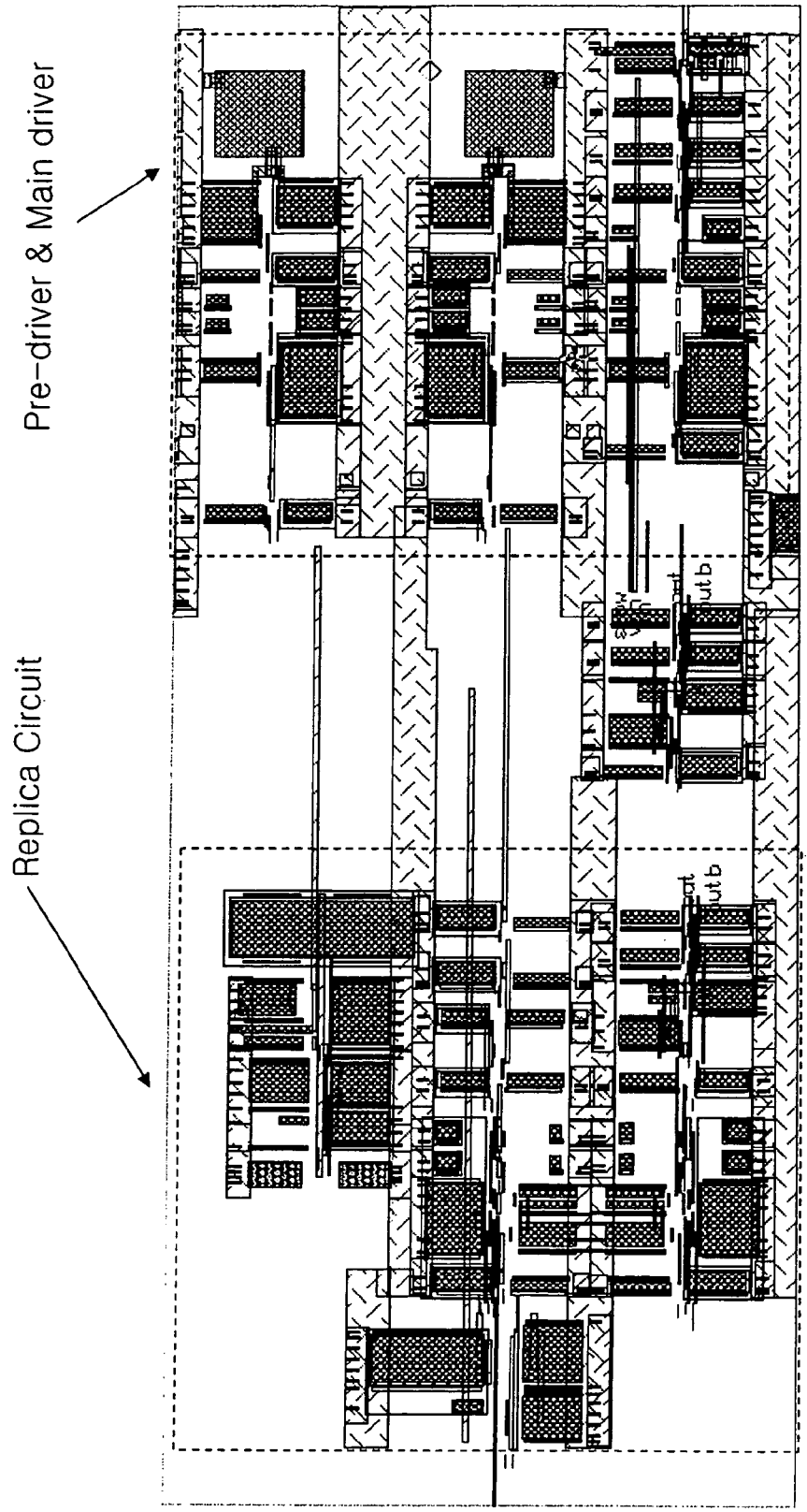
FIG. 13 is a layout diagram of an output driver in accordance with an embodiment of the present invention.

FIG. 13 is a layout diagram of an output driver in accordance with an embodiment of the present invention.

Referring to FIG. 13, it can be seen that the output driver of the present invention has its dimension of 60 μm×70 μm and its replica has its dimension of 60 μm×70 μm when the output driver is designed with IBM 0.1860 μm×70 μm process.

While the present invention has been described with respect to the particular embodiments, it will be apparent to those skilled in the art that various changes and modifications may be made without departing from the spirit and scope of the invention as defined in the following claims.

For example, it is described for an example in which both of slew rate replica 54 and the output level replica 56 are used in the prescribed embodiment. However, the objective of the present invention can be achieved by using the slew rate replica 54.

As described above, the present invention constantly maintains the RC time constant of the pre-driving node by using an external resistor so that the slew rate of the external output waveform can be maintained constantly. Accordingly, the output driver of the present invention may constantly maintain the slew rate regardless of PVT variation.

The present application contains subject matter related to the Korean patent application No. KR 2004-14418, filled in the Korean Patent Office on Mar. 3, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A push-pull type output driver for use in a semiconductor device, comprising:
   a pre-driver for pre-driving a data signal;
   a main driver for receiving an output signal of the pre-driver to thereby drive an output pad in response to the output signal of the pre-driver;
   a slew rate replica for generating pre-driver bias signals to constantly maintain effective resistances of a pull-up path and a pull-down path of the pre-driver by modeling the pre-driver; and
   an output level replica for generating main driver bias signals to constantly maintain a pull-up output level and a pull-down output level of the main driver by modeling the main driver.

2. The push-pull type output driver as recited in claim 1, wherein the pre-driver includes an inverter for performing driving operation in response to the pre-driver bias signals.

3. The push-pull type output driver as recited in claim 2, wherein the pre-driver bias signals are supplied to a pull-up unit and a pull-down unit of the inverter, respectively.

4. The push-pull type output driver as recited in claim 1, wherein the main driver includes an inverter for performing driving operation in response to the main driver bias signals.

5. The push-pull type output driver as recited in claim 4, wherein the main driver bias signals are supplied to a pull-up unit and a pull-down unit of the inverter, respectively.

6. The push-pull type output driver as recited in claim 1, wherein the slew rate replica and the output level replica operate independently to generate the pre-driver bias signals and the main driver bias signals, respectively.

7. The push-pull type output driver as recited in claim 1, wherein the slew rate replica includes:
   an external resistor coupled between a power supply voltage and a dummy pad;
   a first comparator for comparing the potential on the dummy pad with a reference voltage;
   a first pre-driver pull-down replica coupled between the dummy pad and a ground voltage for maintaining the potential on the dummy pad at the level of the reference voltage under control of a pre-driver pull-down bias signal from the first comparator;
   a second pre-driver pull-down replica coupled between the ground voltage and a first node, the second pre-driver pull-down replica having the same configuration as the first pre-driver pull-down replica;
   a second comparator for comparing the potential on the first node with the potential on the dummy pad; and
   a pre-driver pull-up replica coupled between the power supply voltage and the first node for maintaining the potential on the first node at the level of the reference voltage under control of a pre-driver pull-up bias signal from the second comparator.

8. The push-pull type output driver as recited in claim 1, wherein the output level replica includes:
   a first external resistor coupled between a termination voltage and a first dummy pad and having the same resistance as a termination resistor that is coupled to the output pad;
   a third comparator for comparing the potential on the first dummy pad with a low reference voltage;
   a main driver pull-down replica coupled between the first dummy pad and a ground voltage for determining the potential on the first dummy pad under control of a pull-down output level bias signal from the third comparator;
   a second external resistor coupled between the termination voltage and a second dummy pad and having the same resistance as the termination resistor;
   a fourth comparator for comparing the potential on the second dummy pad with a high reference voltage; and
   a main driver pull-up replica coupled between a power supply voltage and the second dummy pad and controlled under a pull-up output level bias signal from the fourth comparator.

9. The push-pull type output driver as recited in claim 7, wherein the pre-driver includes:
   a first PMOS transistor coupled to the power supply voltage and having a gate receiving the pre-driver pull-up bias signal;
   a second PMOS transistor coupled between the first PMOS transistor and an output of the pre-driver and having a gate receiving the data signal;
   a first NMOS transistor coupled to the ground voltage and having a gate receiving the pre-driver pull-down bias signal; and
   a second NMOS transistor coupled between the first NMOS transistor and the output of the pre-driver and having a gate receiving the data signal.

10. The push-pull type output driver as recited in claim 8, wherein the main driver includes:
    a third PMOS transistor coupled the power supply voltage and having a gate receiving the pull-up output level bias signal;
    a fourth PMOS transistor coupled between the third PMOS transistor and the output pad and having a gate receiving the output signal of the pre-driver;
    a third NMOS transistor coupled to the ground voltage and having a gate receiving the pull-down output level bias signal; and
    a fourth NMOS transistor coupled between the third NMOS transistor and the output pad and having a gate receiving the output signal of the pre-driver.

11. The push-pull type output driver as recited in claim 7, wherein the first pre-driver pull-down replica includes:
    a third NMOS transistor coupled to the dummy pad and having a gate receiving the power supply voltage; and
    a fourth NMOS transistor coupled between the third NMOS transistor and the ground voltage and having a gate receiving the pre-driver pull-down bias signal.

12. The push-pull type output driver as recited in claim 7, wherein the second pre-driver pull-down replica includes:
    a fifth NMOS transistor coupled to the first node and having a gate receiving the power supply voltage; and
    a sixth NMOS transistor coupled between the fifth NMOS transistor and the ground voltage and having a gate receiving the pre-driver pull-down bias signal.

13. The push-pull type output driver as recited in claim 7, wherein the pre-driver pull-up replica includes:
    a third PMOS transistor coupled to the power supply voltage and having a gate receiving the pre-driver pull-up bias signal; and
    a fourth PMOS transistor coupled between the third PMOS transistor and the first node and having a gate receiving the ground voltage.

14. The push-pull type output driver as recited in claim 8, wherein the main driver pull-up replica includes:
    a fifth PMOS transistor coupled to the power supply voltage and having a gate receiving the pull-up output level bias signal; and
    a sixth PMOS transistor coupled between the fifth PMOS transistor and the second dummy pad and having a gate receiving the ground voltage.

15. The push-pull type output driver as recited in claim 8, wherein the main driver pull-down replica includes:
    a fifth NMOS transistor coupled to the first dummy pad and having a gate receiving the power supply voltage; and
    a sixth NMOS transistor coupled between the fifth NMOS transistor and the ground voltage and having a gate receiving the pull-down output level bias signal.

16. The push-pull type output driver as recited in claim 7, wherein the level of the reference voltage is substantially ½ level of the power supply voltage.

* * * * *